United States Patent
Halderman et al.

(10) Patent No.: US 6,372,544 B1
(45) Date of Patent: Apr. 16, 2002

(54) METHOD TO REDUCE OCCURRENCES OF FILLET CRACKING IN FLIP-CHIP UNDERFILL

(75) Inventors: Jonathan D. Halderman; Raj N. Master, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/599,530

(22) Filed: Jun. 23, 2000

(51) Int. Cl.$^7$ .................. H01L 21/44; H01L 21/48; H01L 21/50
(52) U.S. Cl. .................. 438/108; 438/106; 438/127
(58) Field of Search ................ 438/106, 108, 438/112, 124, 127, 795, 799

(56) References Cited

U.S. PATENT DOCUMENTS 5,355,580 A * 10/1994 Tsukada ............... 29/840
6,049,038 A * 4/2000 Suzuki ............... 174/52.2

OTHER PUBLICATIONS

Lau, Chip on Board Technologies for Multichip Modules, Chapman & Hall, 1994, pp. 515–516.*

* cited by examiner

Primary Examiner—Matthew Smith
Assistant Examiner—Craig P. Lytle
(74) Attorney, Agent, or Firm—McDermott, Will & Emery

(57) ABSTRACT

A softened and compliant fillet portion of a cured polymeric underfill in a flip-chip arrangement reduces occurences of fillet crackings caused by thermal stresses. The softening of the fillet is achieved by chemically breaking cross-links in the cured polymeric underfill material using a chemical solvent. In another embodiment, the softening of the fillet is achieved by applying heat using a controllable beam of thermal energy to break up the cross-links to thereby soften the fillet.

18 Claims, 6 Drawing Sheets

METHOD TO REDUCE OCCURRENCES OF FILLET CRACKING IN FLIP-CHIP UNDERFILL

BACKGROUND OF THE INVENTION

1. Field of the Invention

The present invention relates to the packaging of integrated circuits and electronic components, and more particularly, to an improved underfill used in a flip-chip arrangement.

2. Description of the Related Art

It is known to form a microelectronic assembly by a direct chip attach method, commonly referred to as flip chip. An example of such microelectronic assembly is the assembly shown in FIGS. 1A and 1B, wherein an integrated circuit die 10 is mounted directly onto a supporting substrate 22. The supporting substrate 22 may be a printed circuit board or a package board with solder bump interconnections 12. The integrated circuit die 10 is spaced apart from the supporting substrate by a gap (not shown), and the solder bump interconnections 12 extend across the gap and connect bond pads 18 on the integrated circuit die 10 to bond pads 20 on the supporting substrate 22. In this manner, the integrated circuit die 10 is attached to the supporting substrate, and electrical signals are conducted to and from the die 10 for processing.

Because of differences in the coefficients of thermal expansion of the die 10 and the supporting substrate 22, stresses are created when the assembly is subjected to thermal cycling of the type experienced during operation. These stresses tend to fatigue the solder bump interconnections 12 and can lead to failure of the assembly. In order to strengthen the solder joints without affecting the electrical connection, the gap is filled with a polymeric underfill material 14.

The underfill material 14 is typically applied after the die 10 is attached by the solder bump interconnections 12 to the supporting substrate 22. A curable polymeric underfill material is dispensed onto the supporting substrate 22 adjacent to the die 10 and is drawn into the gap by capillary action. An additional amount of the underfill material is applied along the edges of the die 10 so as to form a uniform fillet 16 that extends beyond the edge of the die 10 and at least partially up the side of the die 10. The polymeric material is then cured, typically by heating, to form the underfill. The underfill bonds to the die 10, the supporting substrate and the solder bumps thereby strengthens the assembly and protects the solder bump interconnections from environmental damage.

The curing process, however, creates thermal stresses during the heating and cooling of the assembly. Mechanical stresses are also experienced during use of the microelectronic assembly, particularly in portable applications such as cell phones, PDA's, etc. These stresses are normally detrimental to the die and the solder bump interconnections and can cause a detrimental warping of the integrated circuit die. The stresses also lead to cracking of the underfill. As shown in exemplary FIG. 2, the cracking 30 of the underfill commences from fillet 16 and a corner 32 of a die and propagates, with a tremendous force concentrated at the tip of the crack, through the solder bumps which are tightly bonded with the underfill.

Therefore, a need exists to reduce the detrimental effects of thermally induced stresses upon an underfill and the solder bump interconnections of a microelectronic assembly.

Further, a need exists to strengthen and improve the reliability of a microelectronic assembly that includes reducing cracks in the underfill to improve the reliability of electrical intrconnections and to extend the useful life of an underfilled flip-chip arrangement.

SUMMARY OF THE INVENTION

There is, therefore, a need in the art of flip-chip integrated circuit manufacturing for a microelectronic assembly that maintains the proper physical structural integrity and electrical interconnections. Particularly, there is a need to control and reduce the undesirable effect of underfill cracking resulting from thermal stresses caused by, for example, thermal cyclings of an underfilled semiconductor die.

The present invention relates to a fillet portion of an polymeric underfill being softened or compliant to reduce occurences of crackings that may propagate through the underfill causing undesirable effects. Embodiments of the present invention comprise a semiconductor flip-chip arrangement having a semiconductor die with an array of conductive terminals coupled to an array of conductive pads on a supporting surface by solder bumps, including: a polymeric bonding underfill material disposed between the semiconductor die, and the polymeric bonding material further disposed along the edges of the semiconductor die forming a fillet of underfill material surrounding the edges of the semiconductor die, wherein the fillet is made substantially compliant so as to reduce occurences of crackings in the underfill material.

A further aspect of the invention is a method for manufacturing a flip-chip arrangement with flip-chip underfill, including the steps of attaching a semiconductor die to a substrate, underfilling the die, wherein a fillet is created at the perimeter of the semiconductor die, hardening the underfill material including the fillet, and softening only the fillet of the underfill.

Another aspect of the invention is a method for reducing fillet cracking in cured polymeric flip-chip underfill, which include the steps of applying a solvent to the fillet portion of the underfill to soften at least a portion of the fillet, and removing the solvent when the portion of the fillet is softened.

Another aspect of the invention is a method for reducing the occurences of cracking in a fillet in cured polymeric flip-chip underfill, including the steps of determining the location of fillet along a perimeter of a flip-chip, and irradiating the fillet with a thermal radiation source so as to apply thermal energy to the cured polymeric material sufficiently to break cross-links in the cured polymeric material to thereby render the fillet compliant.

The present invention provides significant advantages by reducing occurences of cracking in the underfill of a semiconductor die by rendering the fillet portion of the underfill compliant or soft so as to better absorb or dampen thermal stresses.

Another advantage of the present invention is that the softening of the underfill's fillet can be accomplished by using a conventional chip washing machine loaded with an appropriate solvent and programmed for desired spraying, soaking, rinsing and drying cycles.

Another advantage of the present invention is the high throughput in the softening process of the fillet that can be accomplished using a thermal radiation source, particular a laser.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE INVENTION

The present invention addresses problems related to thermal stresses on an underfill material. The cracking of a fillet, followed by that of the underfill material and solder balls, is prevented by the present invention, in part, by softening the fillet of the underfill material. This is performed through a chemical solvent, for example, or a localized healing process.

A conventional technique for removing an underfilled die from a supporting substrate is performed prior to "reworking" a die. When reworking is necessary to remove semiconductor dice that have been flipped onto a supporting substrates and underfilled with a polymeric bonding material, the dice are treated with a solvent, such as acetone, alcohol, methyl-ethylketone and the like. The normal die removal treatment involves soaking the assembly in the solvent for an extended period of time, which is typically between 12 to 24 hours. The solvent chemically interacts with the underfill material between the die and the substrate to soften the underfill to a degree so that the die can be removed from the substrate.

As mentioned, the underfill material may be a curable polymeric material. It may comprise one or more polymerizable monomers, polyurethane prepolymers, constituents of block copolymers, constituents of radial copolymers, initiators, catalysts, crosslinking agents, stabilizers. Such polymeric materials contain molecules that are chained or cross-linked to form a strong bonding material as they are cured and hardened. The treatment with an appropriate solvent chemically breaks the cross-linked molecules, generally referred to as the cross-links, and essentially uncures the polymeric underfill material. The breaking of the cross-links renders the polymeric material soft and compliant.

Based on the described process for removing underfilled flip-chip from an interconnected support substrate, an embodiment of the present invention utilizes the mechanics for softening the polymeric underfill material normally employed in re-working, but softens only the fillet portion of the underfill so as to provide a compliant, stress-dampening zone surrounding the edges of a flip-chip where undesirable stress-induced cracks often initiate.

An embodiment of the present invention provides a method of softening a fillet portion of an underfilled by a chemical solvent, which will now be described in detail.

Figure 1A:
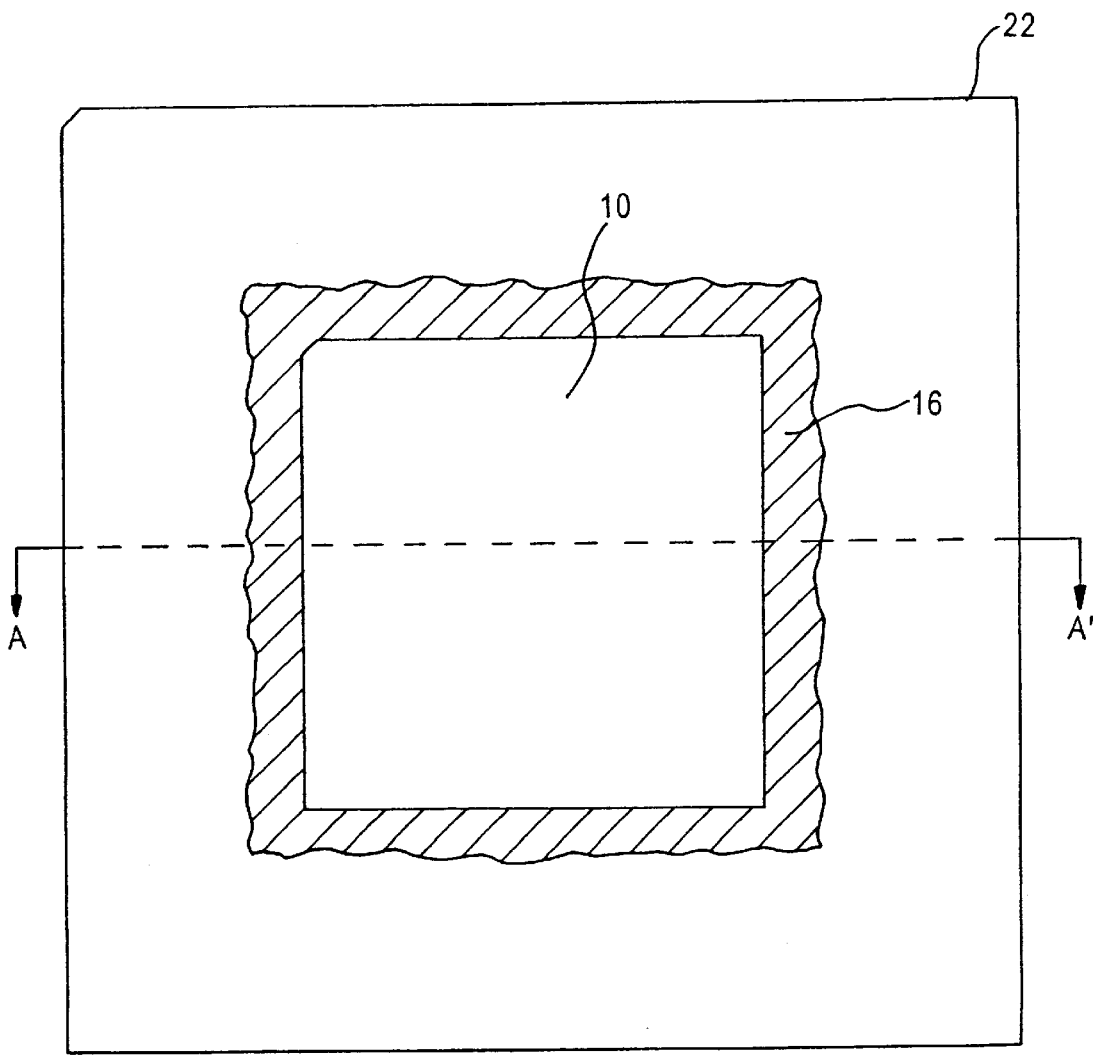
FIG. 1A schematically illustrates a top view of an underfilled flip-chip arrangement with a fillet FIG. 1B schematically illustrates a cross-sectional view of the flip-chip arrangement of FIG. 1A.
Figure 1B:
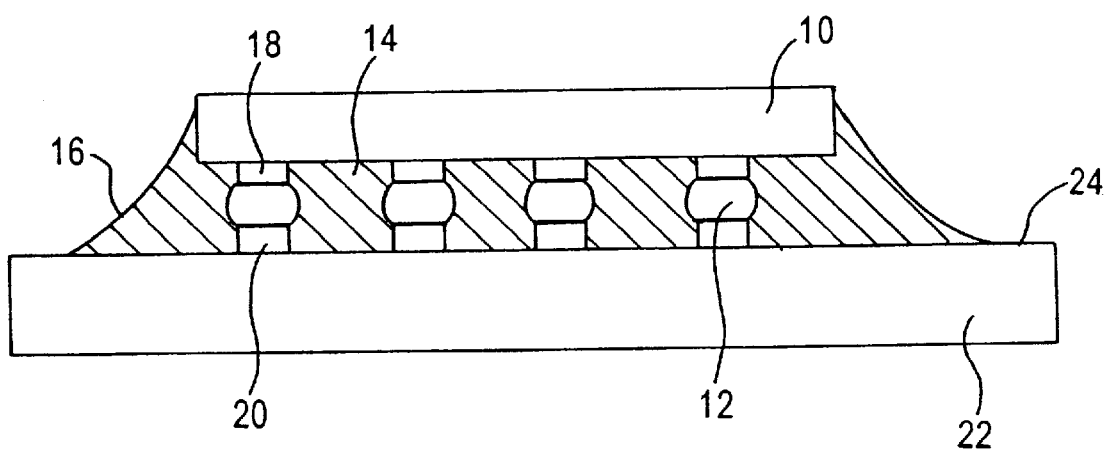
Figure 2:
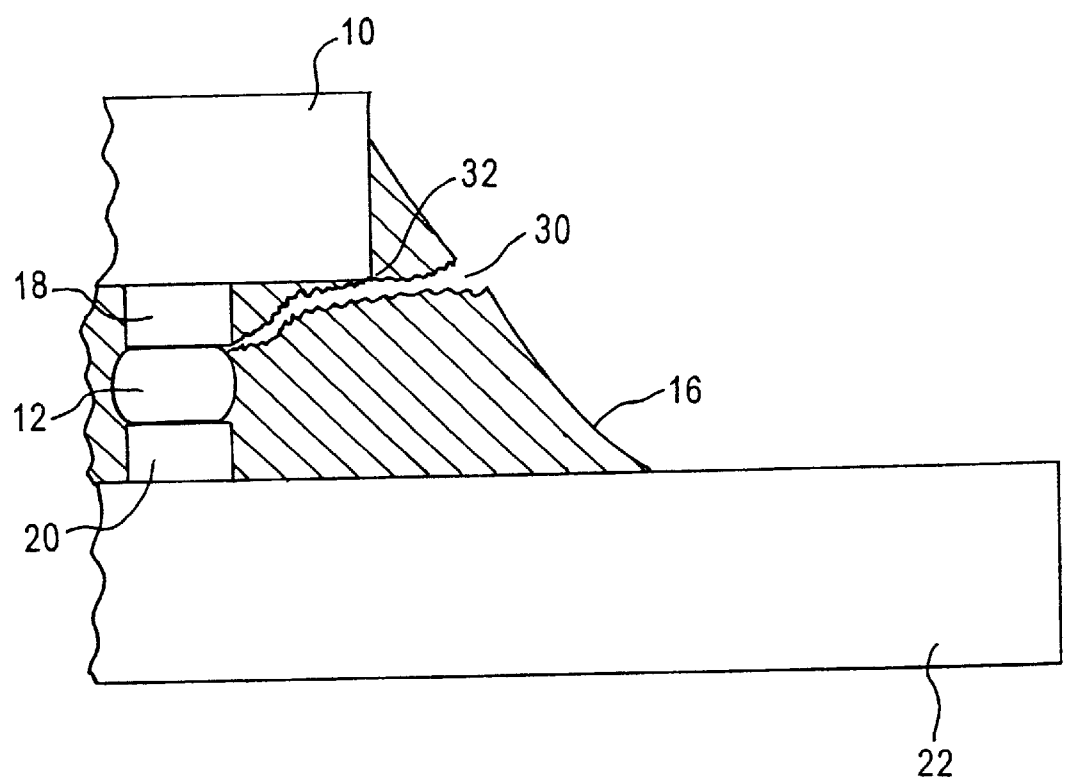
FIG. 2 schematically illustrates a close-up view of a section of an underfilled flip-chip arrangement with stress-induced cracks.
Figure 5:
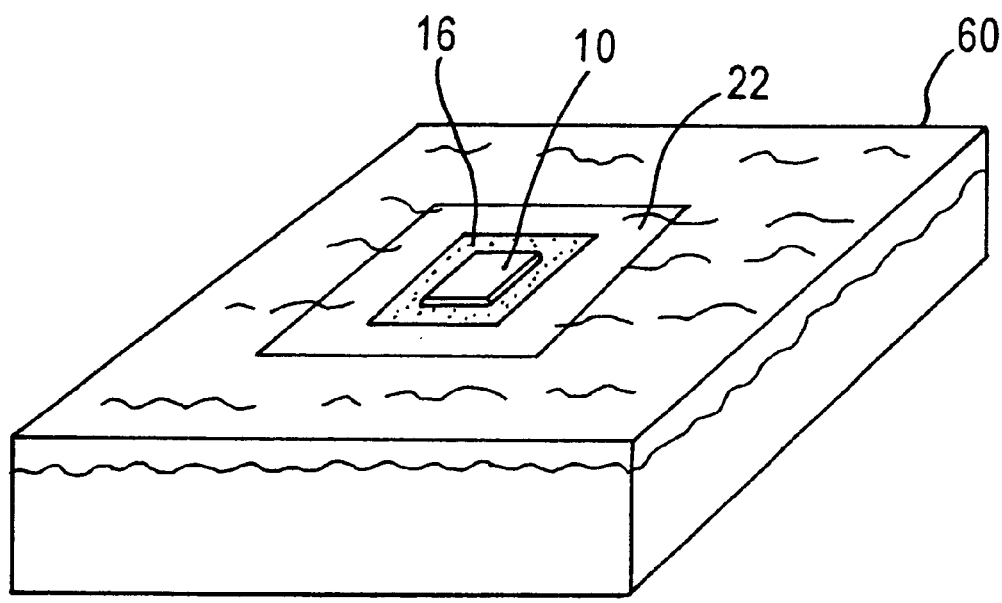
FIG. 5 schematically illustrates another embodiment of the present invention involving a chemical solvent bath.

A conventional chip washing machine, having a chemical bath, such as illustrated in FIG. 5, may be used to apply a liquid solvent, such as acetone, alcohol, methyl-ethylketone and the like, to a semiconductor die with polymeric underfill similar to the the flip-chip arrangement illustrated in FIG. 1 described above. Referring to FIG. 5, the flip-chip arrangement 10, 16 and 22 may be soaked in a bath of the solution 60 for a predetermined soaking time of about 15 minutes to 60 minutes. The soaking time actually is a function of the concentration of the solvent and may vary, as the concentration of the solvent may be diluted before being loaded into the washing machine or become weakened as it is recycled though many soaking cycles. The objective of the soaking step is to allow chemical reaction to take place wherein the solvent chemically breaks up the cross-links in the fillet portion of the polymeric underfill.

The soak time is much shorter than employed in the rework process as the desire is only to soften the fillet, not to remove the die from the substrate. The shorter soak time (e.g., less than 60 minutes) assures that the cross-links in most of the underfill material remain intact, with only the fillet portion being affected. This ensures that the underfill material will continue to serve its intended purposes.

Figure 3:
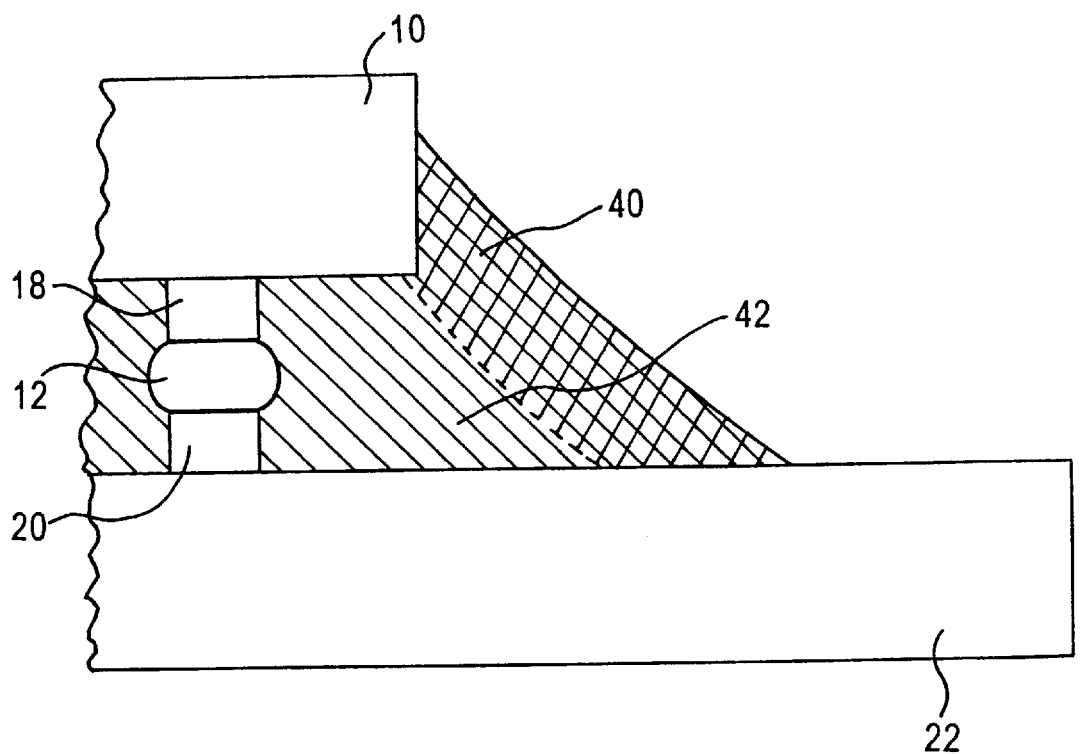
FIG. 3 schematically illustrates an embodiment of the present invention

FIG. 3 illustrates an examplary illustrated result of a softened fillet portion in accordance with a preferred embodiment of the present invention. As shown, the portion 42 of the underfill substantially beneath the semiconductor die 10 remains unaffected and hardened as intended by curing, while the portion 40 of the fillet is softened by the chemical solvent.

After the softening of the fillet using a chemical solvent as described is completed, the flip-chip arrangement is rinsed clean of the solvent and may go through a drying step, such as spin-drying.

Softening a fillet with chemical solvent is advantageous and cost effective, as the process requires only relatively few steps and a conventional chip washing machine may be employed. By using available conventional chip washing machines, no additional investment in expensive specialized apparatus would be necessary.

Under certain circumstances, the use of a solvent may not be advantageous. Therefore, it is also desirable to have an alternative non-chemical process to make a soft and compliant fillet.

As the cross-links in a polymer can be broken chemically by a solvent, an equivalent breakdown of cross-links in polymer chains can also be accomplished thermally. Many heat generating sources can be utilize to soften a polymeric material. A heat generating source can be a torch, laser, thermosonic gun, inductive heater, or the like. However, in working with very small integrated circuit chips and their miniscule peripheral components, such as the fillet of a chip's underfill, a controllable focussed source of thermal energy, such as that from a laser, is an appropriate and preferable tool for the present invention. As such, an exemplary method for applying a concentrated point of thermal energy to soften a fillet is illustrated in FIG. 4, and is now described.

Figure 4:
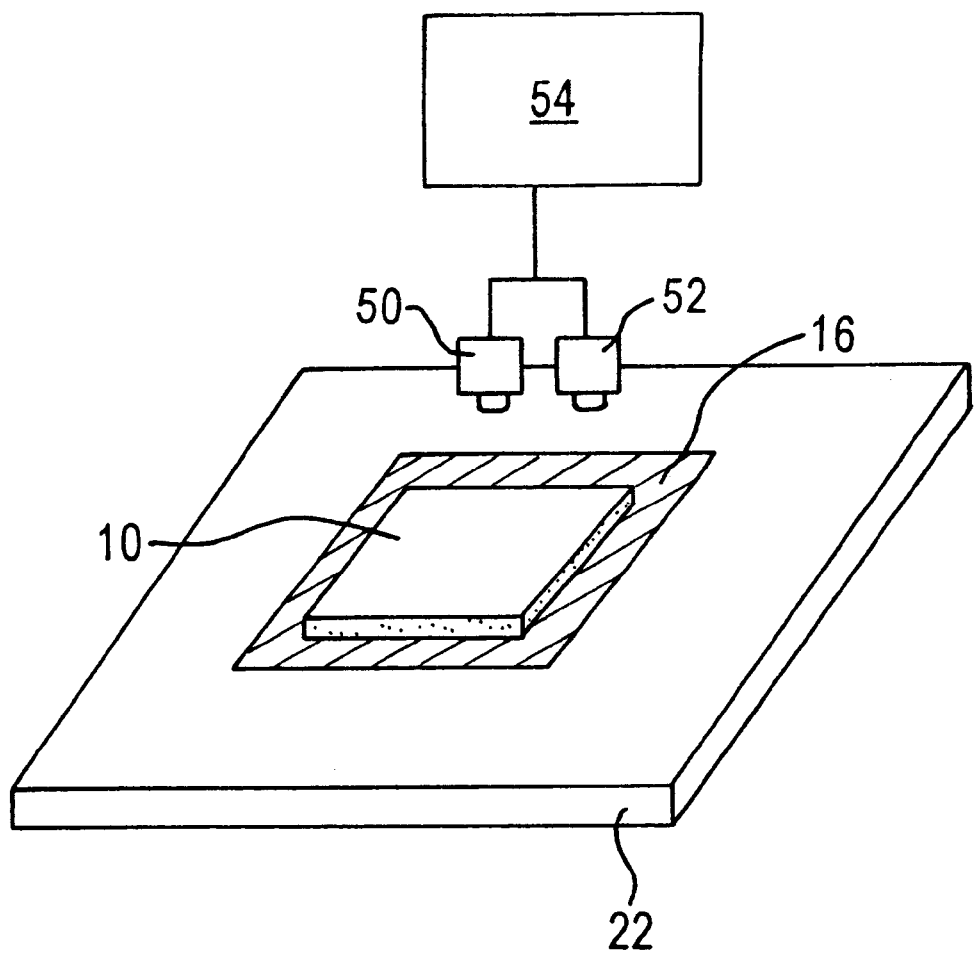
FIG. 4 schematically illustrates an embodiment of the present invention involving the use of a thermal radation source.

As shown in FIG. 4, an underfilled semiconductor die 10 having a fillet 16 is supported by a substrate or a supporting surface 22. Immediately above the semiconductor die 10 is a thermal radiation source 50, which can generate a controllable localized narrow beam of heat, and a temperature detector 52. The thermal radiation source 50 and the temperature detector 52 are controllable by a controller 54, which can be a microcomputer. A suitably localized narrow beam of heat from the source 50 heats up a portion of the underfill's fillet, as the temperature detector 52 monitors the temperature of the fillet. When a predetermined temperature is reached, the beam of heat is turned off or moved to a next target area.

The temperature necessary for breaking polymeric cross-links is a function of the type of polymeric matrix used as the underfill. Therefore, the thermal energy output of the source 50 may be programmed in the controller 54.

The thermal radiation source 50 may include a controlled servomechanism (not shown) so as to allow rasterized scanning, for example, of the beam of heat to targetted areas. Such servomechanism may be controlled by the controller 52 based on the fillet location data stored in the controller 54. The fillet location data may be acquired by an image scanner/analyzer (not shown) and provided to the controller 52, or by pre-programmed topographical and fillet profile data in the controller 52.

In another embodiment of the invention, a temperature detector is not used. As the composition of the polymeric underfill is known, the controller 54 may be programmed to apply appropriate intensity of heat to a portion of the fillet for a predetermined length of time to soften the fillet in a fashion as illustrated in FIG. 3 to create a softened fillet portion 40.

Using heat to soften a fillet of a polymeric underfill of a flip-chip arrangement as set forth has many desirable advantages. For example, when the use of chemical agents is minimized, the cost involved in chemical waste management is reduced, hence, the potential of environmental polution by processing chemicals is also reduced. Further, by using a controlled thermal radiation source as set forth above, a high throughput can be achieved, wherein more fillets can be rendered compliant to reduce occurences of cracking.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A method for reducing fillet cracking in cured polymeric flip-chip underfill, comprising:
    applying a solvent to the fillet portion of the underfill to soften at least a portion of the fillet; and removing the solvent when the portion of the fillet is softened and prior to softening of a remaining portion of the underfill.

2. The method according to claim 1, further comprising:
    soaking the fillet with the solvent for a predetermined soaking time.

3. The method according to claim 2, wherein the predetermined soaking time is selected as a function of the concentration of the solvent.

4. The method according to claim 1, wherein the solvent is acetone, alcohol, or methyl-ethylketone.

5. The method according to claim 1, wherein soaking of the fillet portion comprises breaking the cross-links in the polymeric underfill material to thereby soften the fillet.

6. A method for reducing the occurences of cracking in a fillet in cured polymeric flip-chip underfill, comprising:
    determining the location of fillet along a perimeter of a flip-chip; and,
    irradiating the fillet with a thermal radiation source so as to heat the cured polymeric material sufficiently to break cross-links in the cured polymeric material, wherein the thermal radiation source is a laser.

7. The method according to claim 6, further comprising:
    detecting the temperature of the fillet portion being heated; and
    controlling the thermal radiation source based on the detected temperature of the fillet portion.

8. A method for manufacturing a flip-chip arrangement with flip-chip underfill, comprising:
    attaching a semiconductor die to a substrate;
    underfilling the die, wherein fillets are created at the perimeter of the semiconductor die;
    hardening the underfill material including the fillets; and
    softening only the fillets of the underfill.

9. The method according to claim 8, wherein the underfill is a polymeric material.

10. The method according to claim 9, wherein hardening comprises curing the polymeric material thereby forming cross-links.

11. The method according to claim 10, wherein softening involves breaking the cross-links.

12. The method according to claim 8, wherein softening comprises
    applying heat to the cured fillet surrounding the edge of the flip-chip to thermally break cross-links in the cured polymeric material and render the fillet compliant.

13. The method according to claim 8, wherein breaking the cross-links comprises:
    applying a liquid solvent to chemically break the cross-links in the polymeric material to soften the fillet; and
    removing the liquid solvent after the fillet is substantially softened.

14. The method according to claim 13, wherein the liquid solvent comprises: acetone, alcohol, or methyl-ethylketone.

15. The method according to claim 8, wherein the softening the fillets comprises:
    determining the location of the fillets along a perimeter of a flip-chip; and,
    irradiating the fillets with a thermal radiation source.

16. The method according to claim 15, wherein the thermal radiation source comprises a laser.

17. The method according to claim 15, wherein the thermal radiation source comprises an ultrasonic heater.

18. The method according to claim 15, wherein the thermal radiation source comprises an induction heater.

* * * * *